United States Patent [19]
Otani et al.

[11] Patent Number: 5,205,805
[45] Date of Patent: Apr. 27, 1993

[54] PRINTED CIRCUIT BOARD PROCESSING MACHINE INCORPORATING TOOL HOLDING DEVICE

[75] Inventors: Tamio Otani, Hadano; Yasuhiko Kanaya, Machida; Tetsuo Murakami, Atsugi, all of Japan

[73] Assignee: Hitachi Seiko Ltd., Ebina, Japan

[21] Appl. No.: 944,983

[22] Filed: Sep. 15, 1992

Related U.S. Application Data

[63] Continuation of Ser. No. 577,034, Sep. 4, 1990, abandoned.

[51] Int. Cl.⁵ ............................................. B23Q 3/157
[52] U.S. Cl. .................... 483/9; 364/474.21; 483/8
[58] Field of Search ............ 483/5, 8, 9, 11, 10, 483/7, 4, 54, 55; 364/474.16, 474.17, 474.21, 474.23

[56] References Cited

U.S. PATENT DOCUMENTS

| | | |
|---|---|---|
| 3,173,204 | 3/1965 | Anthony . |
| 3,744,124 | 7/1973 | Gardner . |
| 4,109,188 | 8/1978 | Shima et al. ........................ 318/602 |
| 4,739,488 | 4/1988 | Asakura ........................ 364/474.21 |
| 4,850,766 | 7/1989 | Furuhashi et al. ................... 409/234 |

FOREIGN PATENT DOCUMENTS

| | | | |
|---|---|---|---|
| 155662 | 9/1985 | European Pat. Off. ............... | 483/5 |
| 172434 | 9/1985 | Japan ..................................... | 483/9 |
| 61-736 | 3/1986 | Japan ..................................... | 483/5 |
| 114853 | 5/1987 | Japan ............................. | 364/474.21 |
| 148142 | 7/1987 | Japan ............................. | 364/474.17 |
| 99149 | 4/1988 | Japan ..................................... | 483/5 |
| 229245 | 9/1988 | Japan ............................. | 364/474.21 |
| 256329 | 10/1988 | Japan ..................................... | 483/9 |
| 321149 | 12/1989 | Japan ..................................... | 483/9 |

*Primary Examiner*—William Briggs
*Attorney, Agent, or Firm*—Terry, Stout & Kraus Antonelli

[57] ABSTRACT

A tool holding device for use in a printed circuit board processing machine is provided with a record which is capable of storing data concerning the states of tools held on the tool holding device and data concerning processing conditions and which enables reading and updating of the recorded content through a communication with an external control device. Necessity for renewal of data registered in the NC device, which has to be executed in the known apparatus each time the tool holding device is exchanged, is eliminated thereby improving the rate of operation of the printed circuit board processing machine. In addition, the present invention enables an easy automatic replacement of tools when the lives of the tools are expired.

3 Claims, 5 Drawing Sheets

PRINTED CIRCUIT BOARD PROCESSING MACHINE INCORPORATING TOOL HOLDING DEVICE

This is a continuation of application Ser. No. 07/577,034, filed Sep. 4, 1990 now abandoned.

BACKGROUND OF THE INVENTION

1. Field of the Invention

The present invention relates to a tool holding device for use in a printed circuit board processing machine More particularly, the present invention is concerned with a tool holding device which facilitates administration of tools held by the tool holding device.

2. Description of the Related Art

FIGS. 6 and 7 show a known printed circuit board processing machine in which tool holding devices 4 each having a plurality of tool posts 3 are detachably carried by a table 2 on which printed circuit boards 1 are mounted. The tool holding device 4 holds a plurality of tools of different types necessary for processing the printed circuit board 1. The supply of the tools 5 is conducted by preparing the tool holding device 4 holding the tools 5 on the tool posts 3 in a predetermined order and mounting the device 4 on the table 2 of the printed circuit board processing machine. The positions of the tools 5 held by the tool holding device 4 are defined in terms of values of a coordinate system having an origin P on the printed circuit board processing machine.

On the other hand, an NC device for controlling the printed circuit board processing machine stores data concerning the processing conditions such as the speed of rotation of the spindle, feed speed, number of processing cycles till the expiration of the tool life, for each coordinate position with respect to the origin P.

The NC device produces an instruction for exchanging the tool 5 on the spindle 6, in accordance with a predetermined processing sequence, and selects the processing condition corresponding to the coordinate position of the tool 5. As a result, the spindle 6 picks up the required tool 5 and moves to the processing position on the printed circuit board 1, so that the processing is commenced in accordance with the selected processing condition. At the same time, the NC device stores data concerning the state of use of each tool 5.

After the use of the printed circuit board processing device for a predetermined time, the tool holding device 4 is renewed to supply new tools 5. Among the tools 5 on the tool holding device 4 which has been demounted from the printed circuit board processing machine, the tools 5 which have exhausted are replaced with new tools 5.

Each tool holding device 4 holds many tools, e.g., 50 pieces of tool. These tools are used at different frequencies and under different conditions, so that there are many tools which need not be replaced. Some tools 5 have tips of diameters of 1 mm or smaller. Such tools cannot be subjected to grinding for further use. Thus, it is quite impractical and uneconomical to replace all the tools 5 on the tool holding device 4.

It is therefore necessary that the replacement of the tools 5 is conducted in accordance with data concerning the state of the tools 5 read from the NC device. The operation of the printed circuit board processing machine has to be suspended during reading of the data from the NC device. In addition, when the arrangement of the tools 5 on the tool holding device 4 is changed, it is necessary to update the data concerning the processing conditions registered in the NC device. As a consequence, the rate of operation of the printed circuit board processing machine is lowered disadvantageously.

SUMMARY OF THE INVENTION

Accordingly, a primary object of the present invention is to provide a tool holding device for use in a printed circuit board processing machine which enables replacement of the tools without lowering the rate of operation of the printed circuit board processing machine.

To this end, according to one aspect of the present invention, there is provided a tool holding device comprising a recording means which is capable of storing data concerning the states of tools held on the tool holding device and data concerning processing conditions and which enables reading and updating of the recorded content through a communication with an external control device.

When one of the tools is picked up from the tool holding device by the spindle, data concerning the state of use of this tool is sent to the control device from the recording means in accordance with an instruction produced by the control device.

When the tool is returned to the tool holding device after the use, the content of the data recorded in the recording means is updated to the data transmitted from the control device, in accordance with an instruction given by the control device.

Replacement of tools is conducted in accordance with the data recorded in the recording means and, after the replacement, the data of the newly supplied tools are recorded in the recording means.

Thus, according to the invention, the tool holding device is provided with recording means which store data concerning the states of use of the tools and the replacement of the tools is carried out in accordance with the data read from the recording means. Conventionally, it is necessary to interrupt the operation of the NC device and, hence, to suspend the operation of the printed circuit board processing machine, for the purpose of enabling reading of data from the NC device. In contrast, according to the invention, data can be read without requiring the NC device to suspend the operation, so that the replacement of tools can be conducted without stopping the operation of the printed circuit board processing machine, whereby the rate of operation of the printed circuit board processing machine is remarkably improved.

The above and other objects, features and advantages of the present invention will become clear from the following description of the preferred embodiments when the same is read in conjunction with the accompanying drawings.

DESCRIPTION OF THE PREFERRED EMBODIMENTS

Embodiments of the invention will be described with reference to FIGS. 1 to 5.

Figure 1:
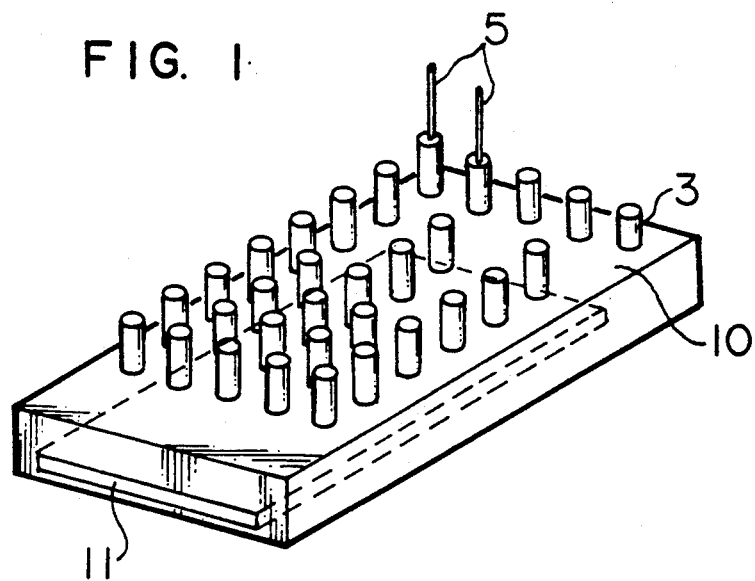
FIG. 1 is a perspective view of a tool holding device embodying the present invention.

Referring first to FIG. 1, a tool holding device 10 of the present invention has a plurality of tool posts 3 carrying tools 5, and is provided with an IC card 11 serving as a recording means.

The IC card 11 incorporates a battery, and has a data recording portion 12, a processing portion 13, a demodulation circuit portion 14, a modulation circuit portion 15, and an antenna 16.

Figure 2:
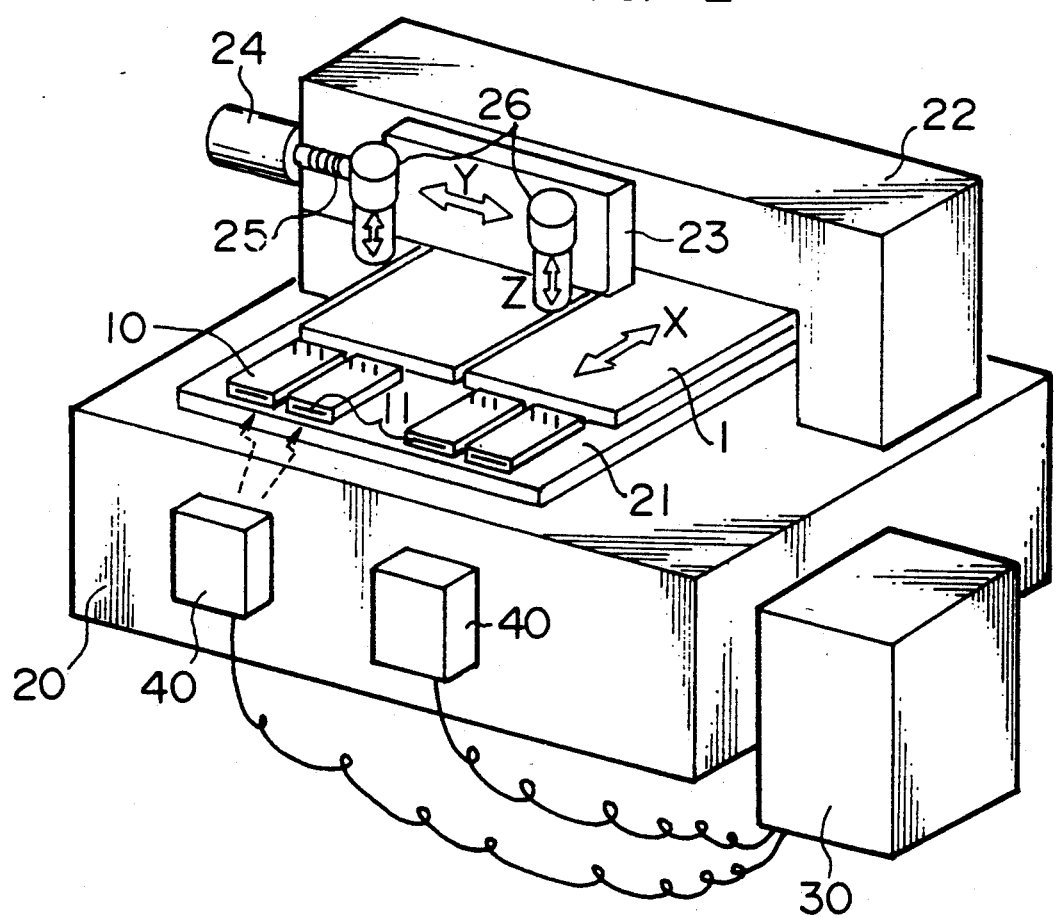
FIG. 2 is a perspective view of a printed circuit board processing machine embodying the present invention.

FIG. 2 shows a printed circuit board processing machine of the invention incorporating the tool holding device 10 shown in FIG. 1. The printed circuit board processing machine has a bed 20 and a table 21 which is carried by the bed 20 for movement in the direction of an arrow X. The table 21 carries a printed circuit board 1 and the tool holding device 10. A column 22 is fixed to the bed 20 so as to bridge over the table 21 A frame 23 is carried by the column 22 for movement in the direction of an arrow Y as it is driven by a feed device having a motor 24 and a feed screw 25. Numeral 26 designates a spindle which is supported by a support member (not shown) movable in the direction of an arrow Z as it is driven by a feed device similar to the feed device for feeding the frame 23. A chuck (not shown) for releasably gripping a tool 5 is provided on the end of the spindle 26.

Figure 4:
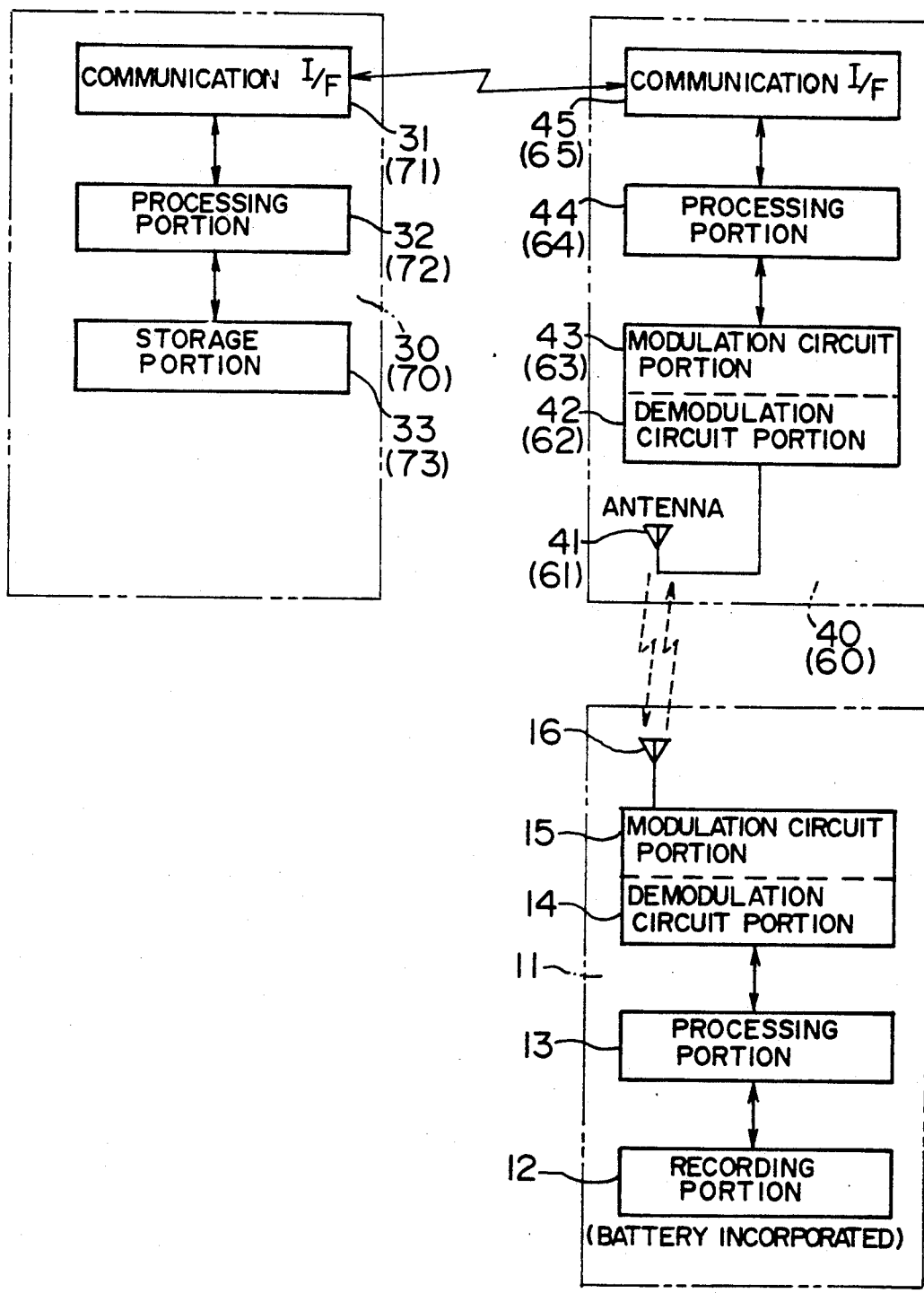
FIG. 4 is a block diagram illustrating flows of signals.
Figure 5:
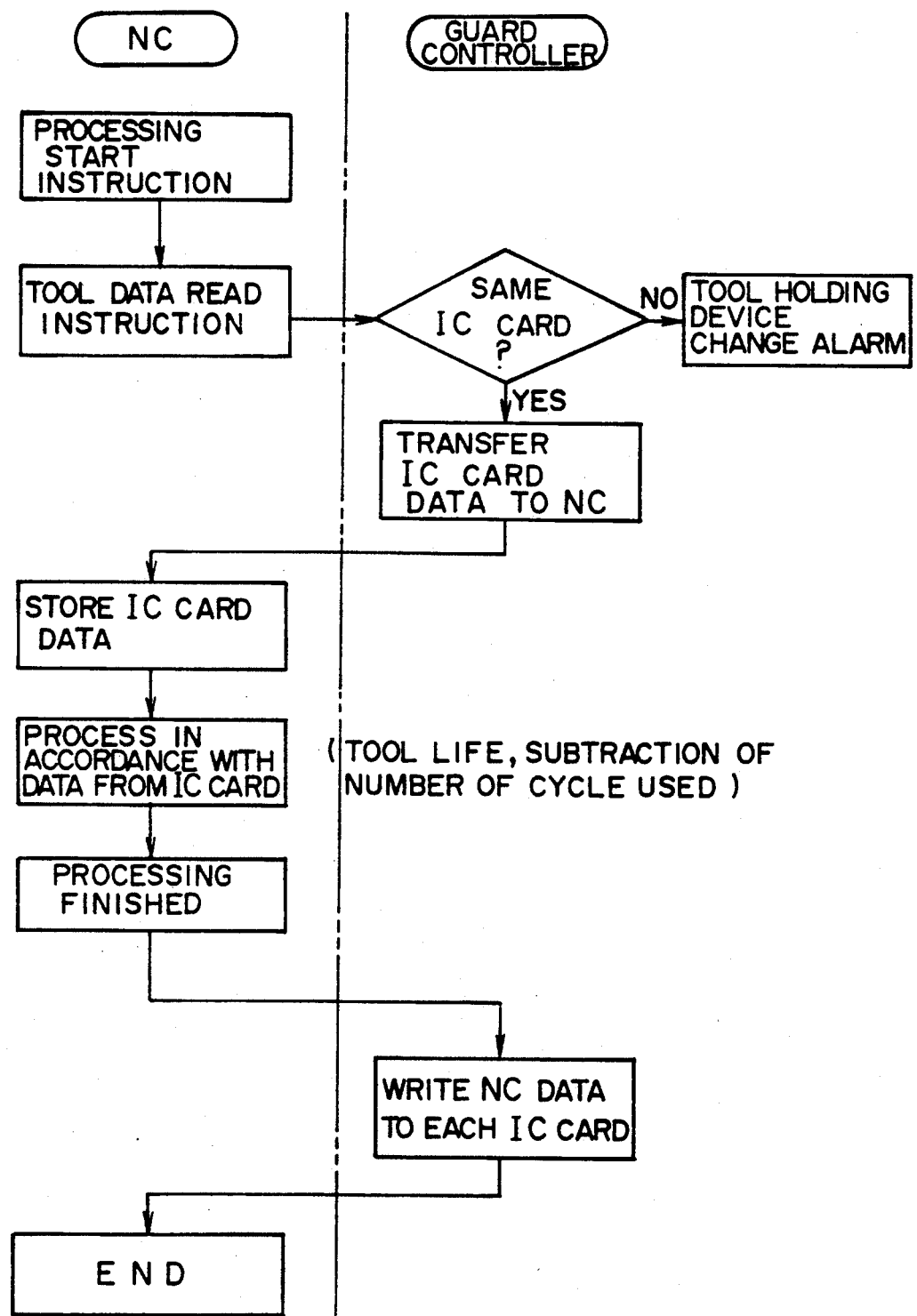
FIG. 5 is a flow chart illustrating a processing sequence.
Figure 6:
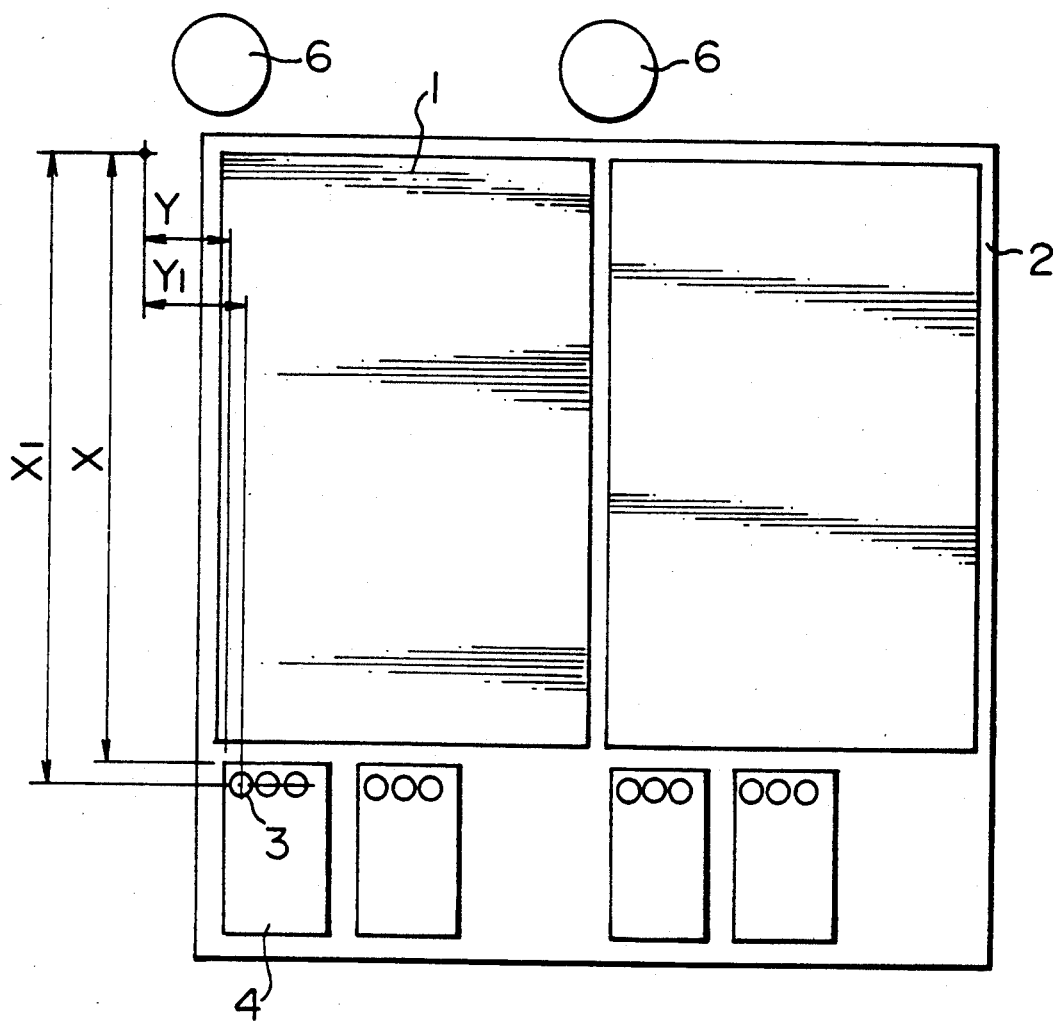
FIG. 6 is a plan view of a critical portion of the printed circuit board processing machine.
Figure 7:
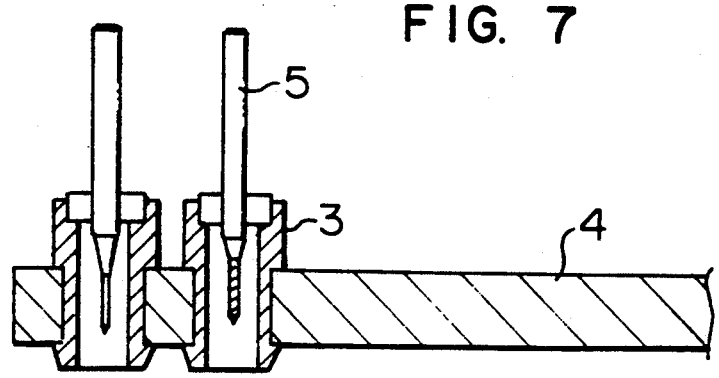
FIG. 7 is a sectional side elevational view of a conventional tool holding device.

Numeral 30 denotes an NC device for numerically controlling the printed circuit board processing machine. As shown in FIG. 4, the NC device 30 has an interface 31 for communication, a processing portion 32 and a storage portion 33.

A communication device 40 is attached to the bed 20 and is connected to the NC device 30. As shown in FIG. 4, the communication device 40 has an antenna 41, a demodulation circuit portion 42, a modulation circuit portion 43, a processing portion 44 and an interface portion 45.

Figure 3:
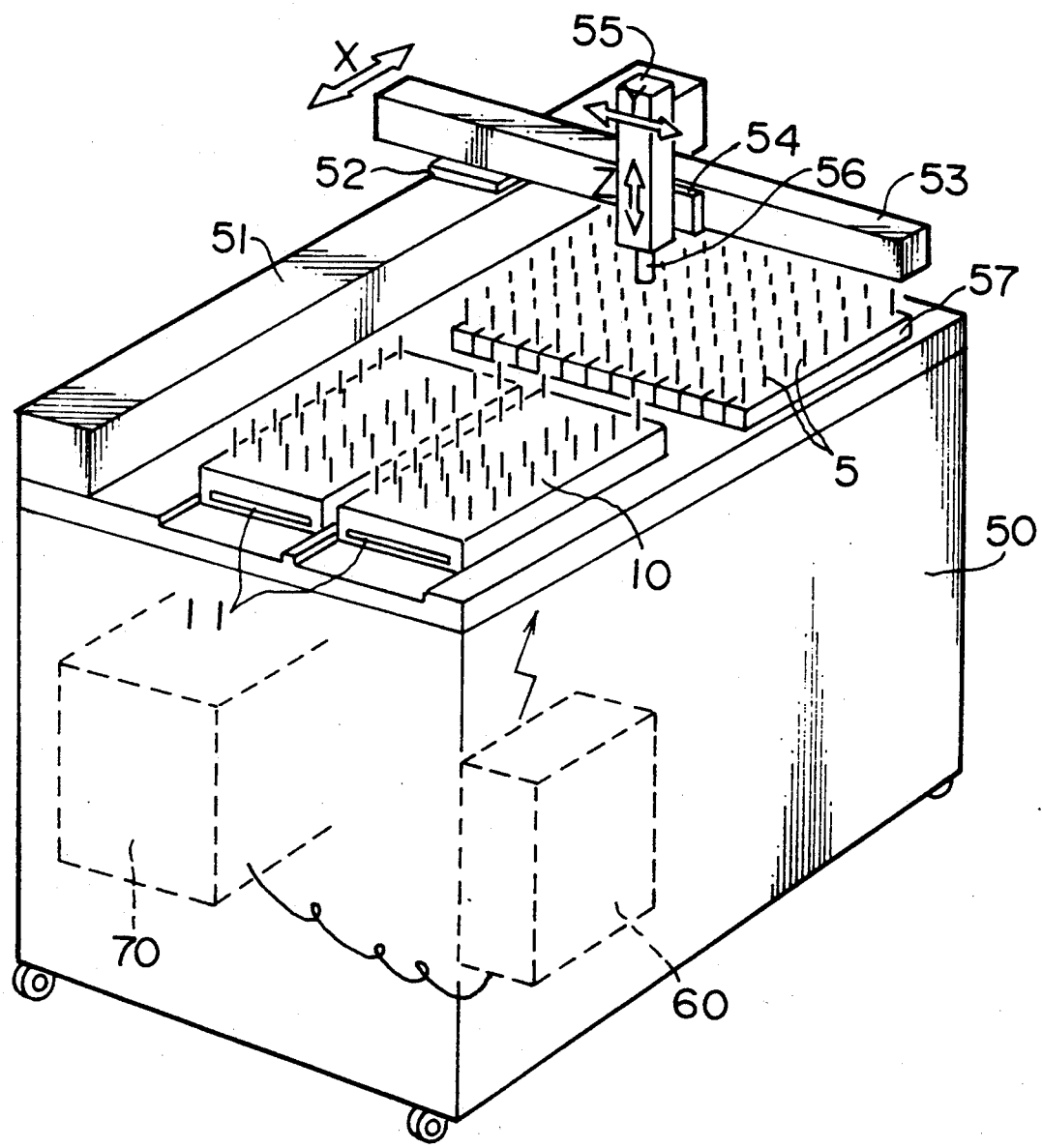
FIG. 3 is a perspective view of a tool replacing apparatus embodying the present invention.

FIG. 3 illustrates a tool replacement apparatus of the invention incorporating the tool holding device 10 of the invention.

The tool replacing apparatus has a bed 50, an X beam 51 fixed to the bed 50 and capable of guiding movement of a movable member 52 in the direction of an arrow X when the movable member 52 is driven by a driving mechanism (not shown), and a Y beam fixed to the movable member 52 and capable of guiding a movable member 54 in the direction of an arrow Y when the movable member 54 is driven by a driving mechanism (not shown). Numeral 55 denotes a replacing head which is fixed to the movable member 54. A chuck 56 is movably supported by the replacement head 55 and is adapted to be moved in the direction of an arrow Z and also to open and close when activated by an actuating means (not shown).

A tool magazine 57, which is detachably supported on the bed 50, holds a plurality of tools for each of different types of tools necessary for the processing of the printed circuit board.

A communication device 60 attached to the bed 50 has a construction similar to that of the aforementioned communication device 40. Namely, it has an antenna 61, a demodulation circuit portion 62, a modulation circuit portion 63, a processing portion 64 and an interface portion 65, as will be seen from FIG. 4.

A control device 70, which is fixed to the bed 50 and connected to the communication device 60, has a construction similar to that of the NC device 30. Namely, it has a communication interface 71, a processing portion 72 and a storage portion 73, as shown in FIG. 4.

When tools 5 are to be used for processing a printed circuit board, the tool holding device 10 is secured to the printed circuit board processing machine. As an instruction for starting the processing of the printed circuit board 1 is issued, the NC device 30 produces an instruction for causing the printed circuit board processing machine to fetch a tool 5 so that the spindle 26 is moved to the position where the aimed tool 5 is located. At the same time, the NC device 30 delivers an instruction to the communication device 40 to cause the communication device to read required data from among the data stored in the IC card 11.

Consequently, the spindle 26 selects a tool located at the designated coordinate position from among the tools held by the tool holding device 10 and picks up the selected tool 5. Meanwhile, the communication device 40 delivers a signal to the IC card 11 and reads the data concerning the tool 5 to be picked up by the spindle 26 from among the data concerning all the tools recorded in the recording portion 12 of the IC card. The communication device 40 then delivers the read data to the NC device 30. The NC device 30 registers the data from the communication device 40 in the storage portion 33 and then reads this data from the storage portion 33 and delivers this data to the processing portion 32, so as to control the printed circuit board processing machine thereby processing the printed circuit board 1. At the same time, the NC device 30 counts the number of the remaining cycles of use of the tool 5 and updates the data concerning this tool 5 with the counted number.

After the work is over, the NC device 30 delivers an instruction to the printed circuit board processing machine so as to enable the spindle 26 to bring the tool 5 thereon back to the initial position on the tool holding device 10. At the same time, the NC device 30 delivers an instruction to the communication device 40 to enable replacement of the data concerning the above-mentioned tool 5 recorded in the recording portion 12 of the IC card 11 with the updated data in the NC device 30.

As a consequence, the printed circuit board processing device drives the spindle 26 back to the designated position on the tool holding device 10, thereby to return the tool 5 to the initial position Meanwhile, the communication device 40 delivers a signal to the IC card 11 so as to update the data concerning the tool 5 in the recording portion 12 of the IC card 11.

Thus, data such as the number of remaining cycle of use of each tool 5, processing condition and so forth are read from the IC card 11, each time the tool 5 is picked up from the tool holding device 10 for the purpose of processing. When the processing is finished with this tool 5, the data in the IC card 11 concerning this tool 5 is updated to the most current data when the tool 5 is returned to the tool holding device 10, whereby all data concerning the tool 5 are recorded in the IC card 11.

The operation for replacing the tools 5 on the tool holding device 10 is as follows The tool holding device 10 is attached to the tool replacing device as shown in FIG. 3. When a tool replacement instruction is given, the control device 70 delivers an instruction to the communication device 60 to cause the device 60 to read the record in the IC card 11. In response to this instruction, the communication device 60 delivers a signal to the IC card 11 to read the content of the record in the IC card and delivers the read data to the control device 70. The control device 70 then stores the delivered data in its storage portion 73. The control device 70 then reads the stored data and produces a tool replacement instruction so as to move the Y beam 53 and the replacing head 55 to make approach to a tool 5 the life of which has been expired. The tool replacement head 55 then picks this tool 5 from the tool holding device 10 and then supplies a new tool 5 of the same type from the tool magazine 57 to the tool holding device 10. At the same time, the control device 70 delivers an instruction to the communication device 60 to enable the latter to record the data concerning the newly supplied tool 5 in the IC card 11.

This operation is repeated for all exhausted tools 5, whereby the exhausted tools are replaced with new tools automatically.

In the embodiment described hereinbefore, an IC card is attached to each of the tool holding device so that the tool holding device is used together with the associated IC card. This, however, is not exclusive and the arrangement may be such that IC cards are usually stored separately from the tool holding devices and, when one of the tool holding devices is mounted on the table, the IC card associated with this tool holding device is inserted into a card insertion opening which is provided in a control device such as NC device.

As has been described, the tool holding device of the present invention is provided with a recording means which is capable of storing data concerning states of tools held on the tool holding device and data concerning processing conditions and which enables reading and updating of the recorded content through a communication with an external control device. The tool holding device of the present invention, therefore, eliminates necessity for renewal of data registered in the NC device which has to be executed in the known apparatus each time the tool holding device is exchanged, thereby improving the rate of operation of the printed circuit board processing machine. In addition, the present invention enables an easy automatic replacement of tools when the lives of the tools are expired.

What is claimed is:

1. A machine tool for machining printed circuit boards comprising: a work spindle movable by a motor; a work table for mounting the printed circuit boards; at least one tool holding device detachably mounted on the work table, said at least one tool holding device including a plurality of tool posts each for receiving a tool and spaced at predetermined intervals; and a controller for programmed controlling of machining and tool changing operations, wherein said at least one tool holding device includes data carrier memory means having stored data corresponding to a degree of wear of all tools located in said at least one tool holding device and a communication device for communicating with said controller for transferring new data corresponding to a new tool installed in said at least one tool holding device to said controller prior to each of said machining and tool changing operations and for updating the stored data in said data carrier memory means after each of machining and changing operations, and wherein said controller causes said communication device to replace said stored data in said data carrier memory means with said new data after replacement of a worn-out tool by a new tool in said at least one tool holding device.

2. A machine tool according to claim 1, wherein said data carrier memory means is an IC card permanently attached to said at least one tool holding device.

3. A machine tool according to claim 1, wherein said data carrier memory means is an IC card detachable from said at least one tool holding device.

* * * * *